United States Patent
Lin et al.

(10) Patent No.: US 9,281,375 B2
(45) Date of Patent: Mar. 8, 2016

(54) METHODS OF PRODUCING BIPOLAR TRANSISTORS HAVING EMITTER-BASE JUNCTIONS OF VARYING DEPTHS AND/OR DOPING CONCENTRATIONS

(71) Applicants: Xin Lin, Phoenix, AZ (US); Bernhard H. Grote, Phoenix, AZ (US); Jiang-Kai Zuo, Chandler, AZ (US)

(72) Inventors: Xin Lin, Phoenix, AZ (US); Bernhard H. Grote, Phoenix, AZ (US); Jiang-Kai Zuo, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 24 days.

(21) Appl. No.: 14/313,114

(22) Filed: Jun. 24, 2014

(65) Prior Publication Data

US 2014/0308792 A1 Oct. 16, 2014

Related U.S. Application Data

(62) Division of application No. 12/909,632, filed on Oct. 21, 2010, now Pat. No. 8,791,546.

(51) Int. Cl.
| | |
|---|---|
| *H01L 21/331* | (2006.01) |
| *H01L 29/73* | (2006.01) |
| *H01L 29/66* | (2006.01) |
| *H01L 21/8222* | (2006.01) |
| *H01L 21/8249* | (2006.01) |
| *H01L 29/735* | (2006.01) |
| *H01L 29/70* | (2006.01) |

(52) U.S. Cl.
CPC ........ *H01L 29/6625* (2013.01); *H01L 21/8222* (2013.01); *H01L 21/8249* (2013.01); *H01L 29/705* (2013.01); *H01L 29/735* (2013.01); *H01L 29/7317* (2013.01)

(58) Field of Classification Search
CPC . H01L 21/74; H01L 21/8222; H01L 21/8249; H01L 27/0623; H01L 29/0804; H01L 29/0821; H01L 29/1004; H01L 29/66272; H01L 29/7322
See application file for complete search history.

(56) References Cited

U.S. PATENT DOCUMENTS

| | | | | |
|---|---|---|---|---|
| 4,060,427 A | * | 11/1977 | Barile | H01L 21/033 148/DIG. 131 |
| 4,157,269 A | * | 6/1979 | Ning | H01L 21/033 148/DIG. 124 |
| 4,180,827 A | * | 12/1979 | Gates | H01L 27/0233 257/556 |
| 4,398,962 A | * | 8/1983 | Kanazawa | H01L 21/033 148/DIG. 92 |
| 4,475,279 A | * | 10/1984 | Gahle | H01L 27/0623 257/370 |
| 4,536,945 A | * | 8/1985 | Gray | H01L 21/28537 257/378 |
| 4,573,256 A | * | 3/1986 | Lechaton | H01L 29/1004 148/DIG. 10 |

(Continued)

*Primary Examiner* — Anh Mai
(74) *Attorney, Agent, or Firm* — Ingrassia Fisher & Lorenz, P.C.

(57) ABSTRACT

Methods for producing bipolar transistors are provided. In one embodiment, the method includes producing a bipolar transistor including first and second connected emitter-base (EB) junctions of varying different depths. A buried layer (BL) collector is further produced to have a third depth greater than the depths of the EB junctions. The emitters and bases corresponding to the different EB junctions are provided during a chain implant. An isolation region may overlie the second EB junction location. The BL collector is laterally spaced from the first EB junction by a variable amount to facilitate adjustment of the transistor properties. The BL collector may or may not underlie at least a portion of the second EB junction. Regions of opposite conductivity type overlie and underlie the BL collector to preserve breakdown voltage. The transistor can be readily "tuned" by mask adjustments alone to meet various device requirements.

20 Claims, 7 Drawing Sheets

20-1

20-2

(56) References Cited

U.S. PATENT DOCUMENTS

| | | | | |
|---|---|---|---|---|
| 4,737,472 A * | 4/1988 | Schaber | H01L 21/8249 | 148/DIG. 124 |
| 4,935,800 A * | 6/1990 | Taguchi | H01L 21/76237 | 257/378 |
| 4,979,010 A * | 12/1990 | Brighton | H01L 29/66272 | 257/513 |
| 4,987,089 A * | 1/1991 | Roberts | H01L 21/8249 | 148/DIG. 82 |
| 5,065,208 A * | 11/1991 | Shah | H01L 21/8249 | 257/370 |
| 5,374,845 A * | 12/1994 | Havemann | H01L 21/28525 | 257/370 |
| 5,605,851 A * | 2/1997 | Palmieri | H01L 21/2253 | 257/E21.147 |
| 6,028,345 A * | 2/2000 | Johnson | H01L 29/1004 | 257/557 |
| 7,282,386 B2 * | 10/2007 | Khemka | H01L 29/063 | 257/E21.358 |
| 7,495,312 B2 * | 2/2009 | Algotsson | H01L 21/8249 | 257/566 |
| 7,927,955 B2 * | 4/2011 | Lin | H01L 29/7322 | 257/E27.053 |
| 8,198,703 B2 * | 6/2012 | Lin | H01L 29/0646 | 257/106 |
| 8,212,292 B2 * | 7/2012 | Lin | H01L 29/7322 | 257/163 |
| 8,384,193 B2 * | 2/2013 | Lin | H01L 29/0821 | 257/197 |
| 8,669,640 B2 * | 3/2014 | Lin | H01L 29/1004 | 257/565 |
| 8,735,950 B2 * | 5/2014 | Chen | H01L 29/872 | 257/272 |
| 9,018,673 B2 * | 4/2015 | Chen | H01L 29/866 | 257/106 |
| 2002/0105053 A1 * | 8/2002 | Sato | H01L 21/8222 | 257/565 |
| 2007/0158777 A1 * | 7/2007 | de Fresart | H01L 29/0847 | 257/492 |
| 2010/0032731 A1 * | 2/2010 | Babcock | H01L 27/095 | 257/280 |

* cited by examiner

METHODS OF PRODUCING BIPOLAR TRANSISTORS HAVING EMITTER-BASE JUNCTIONS OF VARYING DEPTHS AND/OR DOPING CONCENTRATIONS

CROSS-REFERENCE TO RELATED APPLICATION

This application is a divisional of co-pending U.S. application Ser. No. 12/909,632, filed Oct. 21, 2010.

FIELD OF THE INVENTION

The present invention generally relates to semiconductor devices and circuits and methods for fabricating bipolar transistors having emitter-base junctions of varying depths, doping concentrations, or both.

BACKGROUND OF THE INVENTION

Bipolar transistors are much used in modern electronics as individual devices and as part of various integrated circuits (ICs). It is often necessary to adjust (e.g., to "tune") the properties of particular bipolar transistors to suit specific applications, for example and not intended to be limiting, to adjust one or more of the gain, Early voltage, breakdown voltages, current carrying capacity, high-side capability, etc. It is sometimes the case that improving one property (e.g., gain), can adversely affect other properties (e.g., Early voltage and/or breakdown voltage, etc.). This is undesirable. In the prior art it has been customary to tune the properties of particular devices by, for example, adjusting the doping profiles. However, in large scale production this may not be practical since manufacturing optimization and cost considerations often limit the variations in doping profiles that can be used in the manufacturing sequence for a particular semiconductor device or IC. This is especially a concern when both bipolar devices and field effect (e.g., CMOS) devices are being formed in the same manufacturing process. Accordingly, a need continues to exist for improved bipolar transistors and methods for manufacturing the same.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
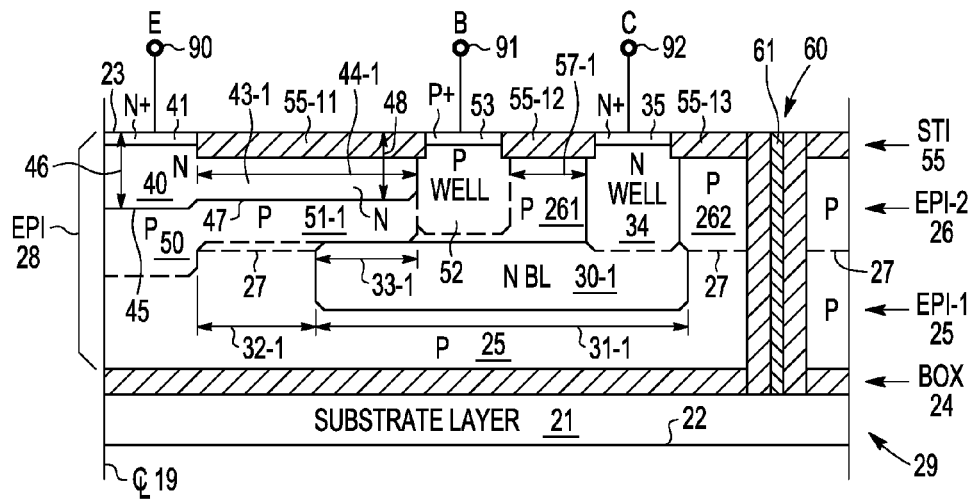
FIG. 1 shows a simplified cross-sectional view about a centerline of an improved bipolar transistor according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" and "SC substrate" are intended to include single crystal structures, polycrystalline structures, amorphous structures, thin film structures, layered structures as for example and not intended to be limiting, semiconductor-on-insulator (SOI) structures, and combinations thereof.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type is then either P or N type. Various embodiments of the invention will be illustrated for NPN bipolar transistors, but this is merely for convenience of description and is not intended to be limiting. Persons of skill in the art will understand that PNP transistors and other semiconductor devices and circuits embodying either or both NPN and PNP combinations may be provided by appropriate interchange of conductivity types in the various regions.

Adjusting doping profiles to suit particular device needs is a straightforward way to optimize device properties. However, adding or modifying process steps to provide a desired bipolar device characteristic generally adds cost and complexity. This is especially of concern for Bi-CMOS processes used to manufacture bipolar and field effect devoices at the same time on the same substrate. Accordingly, a need exists for improved bipolar transistors and methods for manufacturing the same: (i) that are adapted to being "tuned" to suit particular applications, (ii) that accommodate a wide range of design space with little or no compromise of other properties, and (iii) that can be accomplished by layout adjustments without adding or significantly modifying process steps that would increase manufacturing cost. With the embodiments described below, bipolar device properties can be substantially modified just by layout adjustments. These embodiments can provide a wide design space without adding process cost. Thus, doping and masking steps can be shared with other devices on the wafer or chip without the bipolar transistors imposing undesirable constraints on process optimization.

It has been discovered that broadly tunable high gain, high breakdown voltage, bipolar transistors with significant high-side capability can be provided by incorporating multiple emitter-base junctions having different emitter-base junction depths, desirably combined with a depletable collector structure. In preferred embodiments different base doping is provided under the various emitter-base junctions. Additional tuning of the device properties can be achieved by varying the emitter-collector lateral separation.

Figure 3:
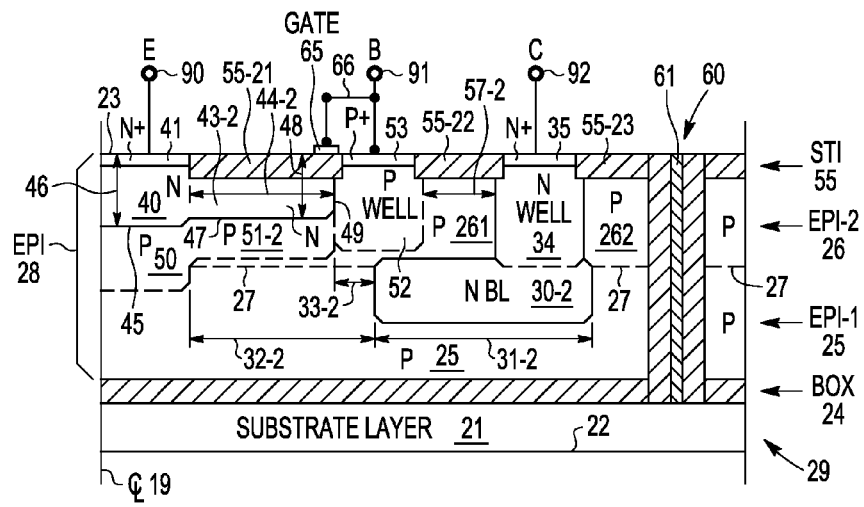
FIG. 3 shows a simplified cross-sectional view about a centerline of an improved bipolar transistor according to still another embodiment of the present invention.
Figure 4:
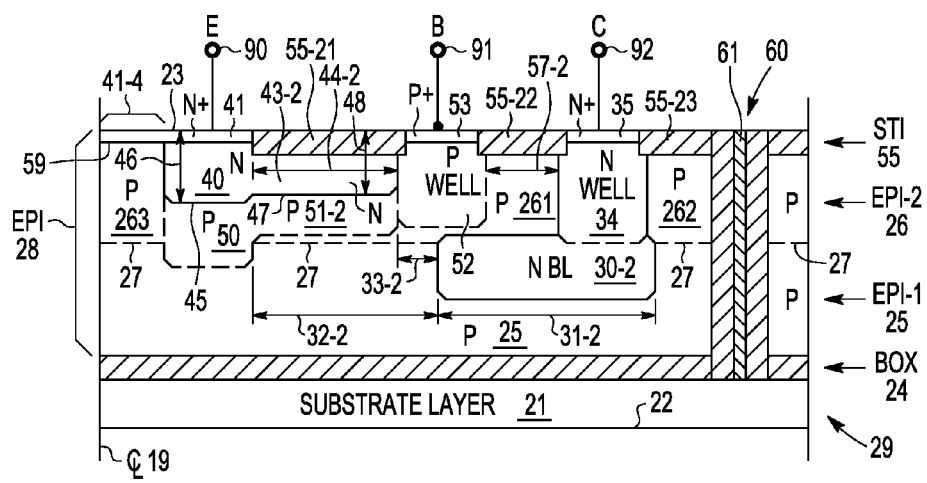
FIG. 4 shows a simplified cross-sectional view about a centerline of an improved bipolar transistor according to yet another embodiment of the present invention.
Figure 5:
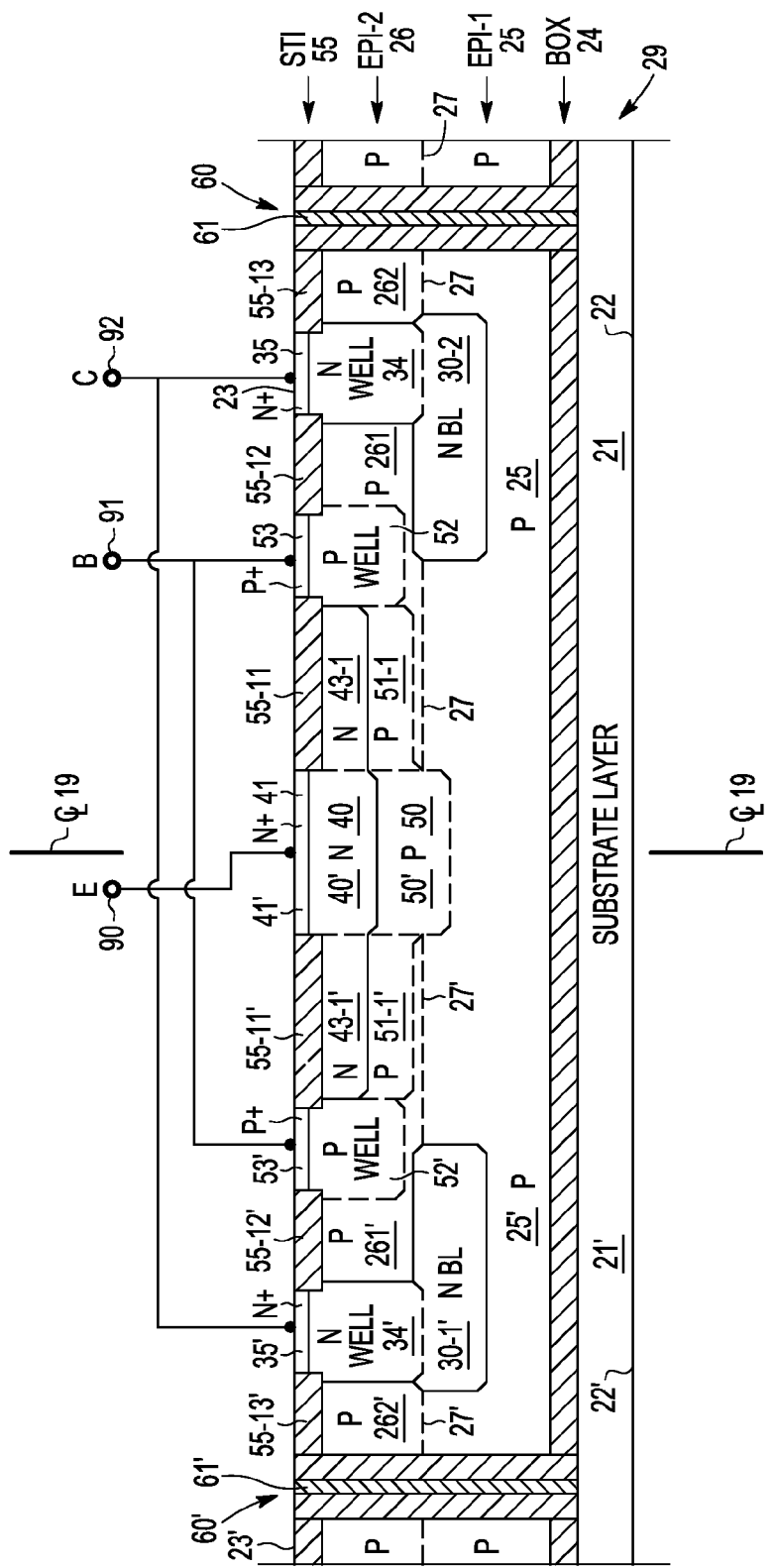
FIG. 5 shows a simplified cross-sectional view of the transistor of FIG. 1 wherein both halves of the transistor about the centerline are included.

FIGS. 1-4 show simplified cross-sectional views laterally from centerline 19 of improved bipolar transistors 20-1, 20-2, 20-3, 20-4, (collectively transistors 20) according to various embodiments of the present invention, and FIG. 5 shows, by way of example, transistor 20-1 of FIG. 1 with both halves of the transistor about centerline 19 included. The drawings illustrate the conductivity types appropriate for NPN transistors, but those of skill in the art will understand that this is merely for convenience of description and not intended to be limiting. Also for convenience of description and not intended to be limiting, the convention is adopted of referring to the various embodiments depicted in FIGS. 1-5 and various regions in such embodiments, by using a primary reference number to identify a particular element that may be present in all of the embodiments followed by a suffix to identify the particular embodiment to which it applies. For example, in the embodiment of FIG. 1, transistor 20 is identified as transistor 20-1 and in the embodiment of FIG. 2 transistor 20 is identified as transistor 20-2. Correspondingly, the collector buried layer (BL) is identified as BL 30-1 in transistor 20-1 of FIG. 1 and BL 30-2 in transistor 30-2 of FIG. 2. Where it is intended to point out that a particular element may be different in various embodiments, a suffix is used and where a particular element may be substantially similar in various embodiments, no suffix is used or the same suffix may be used in multiple embodiments for those elements that can be substantially similar in such embodiments. This convention is generally followed throughout and is intended for convenience of explanation and not limitation; in particular, it is not intended to infer that elements with no suffixes or with common suffixes must be unchanged from embodiment to embodiment or similar in all such embodiments.

Referring now to FIGS. 1-5, transistors 20 comprise substrate layer 21 having lower or bottom surface 22. Substrate layer 21 may be a semiconductor (SC) or dielectric substrate. In a preferred embodiment for NPN transistors, substrate layer 21 is N type but may be of other conductivity type in other embodiments for either NPN or PNP transistors or may be an insulating substrate. In a preferred embodiment substrate layer 21 is a semiconductor (SC) and buried oxide (BOX) layer 24 overlies substrate layer 21. Above BOX layer 24 is semiconductor (SC) layer 28, preferably an epitaxial (EPI) layer extending to upper surface 23. For convenience of description and not intended to be limiting, layer 28 is henceforth referred to as "EPI layer 28" or "EPI 28", but persons of skill in the art will understand that SC layer 28 formed by other means may also be used and the designation "EPI" as used herein for layer 28 is intended to include such other means of formation. Reference number 29 in FIGS. 1-5 and 8-14 is intended to refer to the combination of substrate layer 21 and layer 28, with or without BOX layer 24 and/or buried layer 30, as illustrated further in connection with FIGS. 7-8. For convenience of description the terms "substrate 29" and "substrate (29)" are used when referring to this combination. As is explained in more detail in connection with FIGS. 6-14, layer 28 is desirably formed from two stacked EPI layers, EPI-1 layer 25 and EPI-2 layer 26 that join at interface 27, but a single SC layer may also be used in other embodiments.

Lying within EPI layer 28 at or near interface 27 is (e.g., N type) buried layer (BL) 30 of lateral width 31. Extending from (e.g., N type) BL 30 substantially to surface 23 is (e.g., N type) WELL region 34. Collector contact (e.g., N+) 35 is provided at surface 23 in WELL region 34, and is coupled to collector terminal 92. Extending into EPI layer 28 from surface 23 is (e.g., N type) first emitter region 40. Emitter contact (e.g., N+) 41 is provided at surface 23 in Ohmic contact with (e.g., N type) first emitter region 40 and is coupled to emitter terminal 90. Also extending into EPI layer 28 from surface 23 are shallow trench isolation (STI) regions 55 of, for example, a dielectric such as silicon oxide. Toward the right in FIGS. 1-4 and at both left and right in FIG. 5, are (e.g., dielectric) deep trench isolation (DTI) regions 60, also typically of silicon oxide, extending in preferred embodiments substantially from surface 23 to substrate layer 21. In combination with BOX layer 24, DTI regions 60 serve to isolate transistors 20 from other devices or regions on substrate layer 21. In a preferred embodiment, conductive (e.g. poly-semiconductor) core 61 is provided in DTI regions 60 but may be omitted in other embodiments. Techniques for creating such STI and DTI regions are well known in the art. STI regions 55 are particularly identified as STI regions 55-11, 55-12, 55-13 in transistor 20-1 of FIGS. 1 and 5, and as STI regions 55-21, 55-22, 55-23 in transistors 20-2, 20-3, 20-4 of FIGS. 2-4.

Underlying surface 23 at the left of STI regions 55-11 and 55-21 are (e.g., N type) first emitter regions 40 with (e.g., N+) of depth 46 from surface 23 and with emitter contacts 41 at surface 23. Underlying STI regions 55-11 and 55-21 are (e.g., N type) second emitter regions 43 of lateral width 44, particularly identified as (e.g., N type) second emitter regions 43-1 of width 44-1 in FIGS. 1 and 5 and (e.g., N type) second emitter regions 43-2 of width 44-2 in FIGS. 2-4, and collectively referred to as second emitter regions 43. Underlying (e.g., N type) first emitter regions 40 are (e.g., P type) first base regions 50 that form (e.g., NP) first emitter-base junctions 45 at depth 46 from surface 23. Underlying (e.g., N type) second emitter regions 43 are (e.g., P type) second base regions 51 that form (e.g., NP) second emitter-base junctions 47 at depth 48 from surface 23. It will be understood by those of skill in the art that junctions 45 and 47 may be NP or PN junctions depending upon whether NPN or PNP transistors are being formed. Second base regions 51 are particularly identified as regions 51-1 in device 20-1 of FIGS. 1 and 5, and regions 51-2 in devices 20-2, 20-3, 20-4 of FIGS. 2-4, and collectively referred to as second base region 51. In general, (e.g., P type) first base regions 50 have about the same lateral extent as (e.g., N type) first emitter regions 40, and (e.g., P type) second base regions 51 have about the same lateral extent as (e.g., N type) second emitter regions 43, but other dimensions may also be used in other embodiments.

Figure 2:
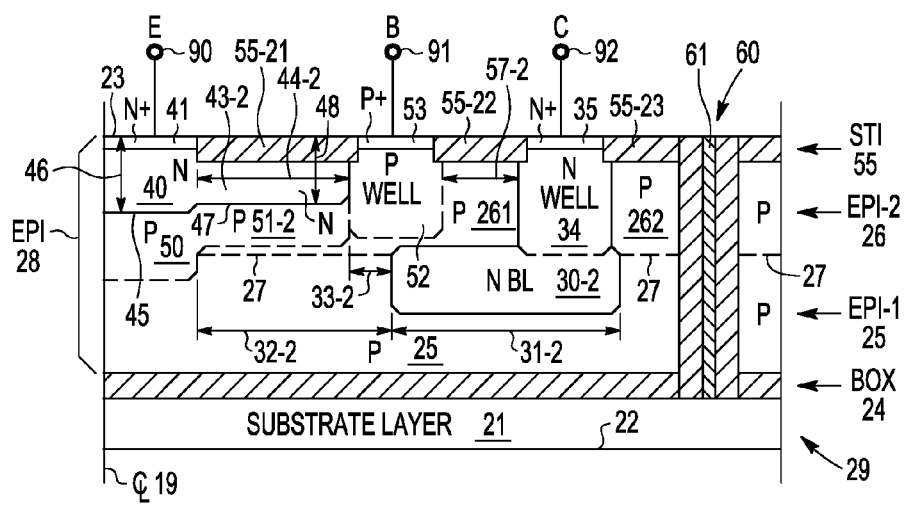
FIG. 2 shows a simplified cross-sectional view about a centerline of an improved bipolar transistor according to another embodiment of the present invention.

Laterally adjacent to second emitter regions 43 and in Ohmic contact with (e.g., P type) second base regions 51 are (e.g., P type) WELL regions 52 extending from surface 23 to a depth sufficient to provide a relatively low resistance Ohmic connection to second base regions 51. Base contacts (e.g., P+) 53 extend from surface 23 into (e.g., P type) WELL regions 52 and are coupled to base terminal 91. Below STI regions 55-12 of device 20-1 of FIGS. 1 and 5 and 55-22 of device 20-2, 20-3, 20-4 of FIGS. 2-4 are (e.g., P type) regions 261 of width 57-1 in FIGS. 1 and 5 and 57-2 of FIGS. 2-4, also referred to collectively as width 57. Regions 261 of lateral width 57 lie substantially between (e.g., P type) WELL regions 52 and (e.g., N type) WELL regions 34. In transistors 20, to the right of (e.g., N type) WELL regions 34, between WELL regions 34 and deep trench isolation regions 60 lie (e.g., P type) regions 262. As is subsequently explained, the doping of regions 261, 262 is determined substantially by the doping of EPI-2 layer 26.

Depth 46 of first emitter-base junction 45 and depth 48 of second emitter-base junction 47 are different, as are the depth and doping of underlying (e.g., P type) base regions 50 and 51. These differences in combination with the ability to vary lateral emitter-collector spacing and overlap allow great flexibility in "tuning" the transistors to suit various applications. In preferred embodiments, first emitter-base junctions 45 are deeper than second emitter-base junctions 47, that is, depth 46 exceeds depth 48. Also in preferred embodiments, the doping of first base regions 50 is less than the doping of second base regions 51.

Transistor 20-1 of FIGS. 1 and 5 differ from transistors 20-2, 20-3, 20-4 of FIGS. 2-4 in that collector lateral width 31-1 is larger than collector lateral width 31-2 and the amount by which collectors 30-1 and 30-2 do or do not underlie second emitters 43-1, 43-2 are different. By way of example and not intended to be limiting, in device 20-1 of FIGS. 1 and 5, BL collector 30-1 underlies second emitter 43-1 by overlap distance 33-1 and is laterally spaced distance 32-1 away from first emitter 40. Separating collector BL 30-1 from emitter 40 by lateral distance 32-1 significantly improves the Early Voltage and emitter-collector breakdown voltage (BVceo) of transistors 20-1 of FIGS. 1 and 5 with little adverse effects on other key device parameters. By way of example and not intended to be limiting, in devices 20-2, 20-3, 20-4 of FIGS. 2-4, BL collector 30-2 does not underlie second emitter 43-2, is spaced lateral distance 33-2 therefrom and is laterally spaced distance 32-2 away from first emitter 40. Such configuration further improves the Early Voltage of transistors 20-2, 20-3 and 20-4 in FIGS. 2-4.

Transistor 20-3 of FIG. 3 differs from transistor 20-2 of FIG. 2 in that conductive (e.g., doped poly) gate 65 is provided over a portion of STI region 55-21 and electrically coupled, for example, to base contact 53 by connection 66 to act as a field plate. In other embodiments, gate 65 may be connected to other dynamic or static potential sources. Either arrangement is useful. Bias on conductive gate 65 is expected to modulate the carrier concentration of vertical emitter-base junction 49 laterally located between emitter 43-2 of FIG. 3 and PWELL 52 underneath STI 55-21. This can provide further improvement in the emitter-base junction breakdown voltage (BVebo).

Transistor 20-4 of FIG. 4 differs from transistor 20-2 of FIG. 2, in that emitter portion 41-4 of (e.g., N+) emitter contact 41 extends over (e.g., P type) portion 263 of EPI 28, so that (e.g., N+) portion 41-4 of emitter contact 41 acts as a further or third emitter forming further or third (e.g., NP) emitter-base junction 59 with (e.g., P type) portion 263 that acts as a further or third base region. Forming third emitter-base junction 59 in this manner can further improve the current gain of transistor 20-4 due to the relatively high doping concentration of third emitter 41-4 and the relatively low doping concentration in third base portion 263. Third base portion 263 is formed from EPI-2 layer 26 (e.g., see FIG. 8) and, as will be subsequently explained, is relatively lightly doped so that it can be fully depleted when the emitter-base junctions are reverse biased. The complete depletion of portion 263 takes place before the breakdown of PN junction 59 between third emitter 41-4 and third base portion 263. Accordingly, including portion 41-4 can improve current gain without impairing breakdown voltages and other key device parameters. While the various embodiments of transistors 20 illustrated in FIGS. 1-4 show particular combinations of elements, sizes, shapes, spacings, etc., these are intended by way of example and not limitation. Variations in lateral sizes, shapes and spacings 31, 32 and 33 may be combined with conductive gate 65 and/or with third emitter 41-4 to provide a wide range of device properties, to facilitate "tuning" bipolar transistors 20 to suit a particular applications (e.g., achieving a desired gain and/or Early voltage) without significant adverse effect on other desirable properties (e.g., while still achieving a desired breakdown voltage BVebo and/or BVcbo and/or BVceo, and/or achieving a desired high-side capability, etc.). This is very useful.

FIGS. 6-14 show simplified cross-sectional views of bipolar transistors 20 of FIGS. 1-5 during various stages 406-414 of manufacture. Structures 506-514 result from manufacturing stages 406-414 respectively. For convenience of explanation and not intended to be limiting, the structure associated with FIGS. 1 and 5 is illustrated in connection with manufacturing stages 406-414 of FIGS. 6-14, but persons of skill in the art will understand that the embodiments of transistors 20-2, 20-3, 20-4, etc., illustrated in FIGS. 2-4 may also be formed using substantially similar manufacturing stages, for example, merely with appropriate mask changes in the case of transistors 20-2 and 20-4 and/or by additionally providing conductive gate 65 in the case of transistor 20-3, or any combination thereof. Adding conductive gate 65 generally does not require added process steps since providing conductive layers or regions of a particular geometry is a common feature of essentially all SC manufacturing processes and may be accomplished by simple mask changes without added process steps. Because FIGS. 6-14 are intended by way of example and not limitation to illustrate the fabrication of device 20-1 of FIGS. 1 and 5, the custom is adopted of referring to various regions by those reference numbers associated with FIGS. 1 and 5, even though it will be understood that analogous regions in FIGS. 2-4 are fabricated in substantially the same way except for mask changes. Thus, references to regions 43-1, 51-1, 55-11, 55-12, 55-13, etc., are intended to include analogous regions 43-2, 51-2, 55-21, 55-22, 55-23, etc. Unless otherwise noted, doping of various regions within devices 20 is preferably accomplished either: (a) during epitaxial growth of various layers, or (b) by ion implantation, or (c) by a combination thereof, but this is not intended to be limiting and other doping means may also be used. For ion implantation, photoresist is a suitable mask material and unless otherwise noted is used throughout, but other mask material may also be used.

Figure 6:
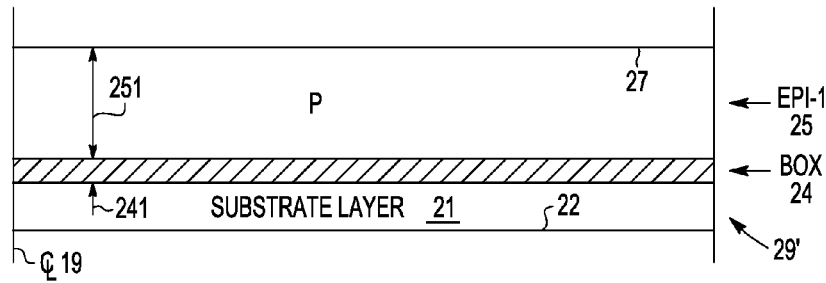
FIGS. 6-14 show simplified cross-sectional views of the bipolar transistors of FIGS. 1-5 during various stages of manufacture.

Referring now to manufacturing stage 406 of FIG. 6, substrate layer 21 is provided having thereon BOX layer 24 and, for example, EPI-1 layer 25. This combination is also referred to as "substrate 29'" or "substrate (29')" analogous to the use of "substrate 29" explained earlier, but with the prime (')

added to indicate that it is a precursor to substrate 29, e.g., lacking layer 26. Substrate layer 21 may be semiconductor (SC) or insulator, and if SC, either N or P type. In a preferred embodiment, where transistor 20 is an NPN transistor, then substrate layer 21 is preferably N type with doping usefully in the range of about 5E14 to 1E18 cm$^{-3}$, preferably about 1E15 to 5E15 cm$^{-3}$, but higher or lower doping levels can also be used. BOX layer 24 is conveniently formed of oxide but other dielectrics can also be used. BOX layer 24 has thickness 241 desirably in the range of about 0.1 to 1.0 micrometers, preferably in the range of about 0.2 to 0.6 micrometers, but thicker or thinner layers can also be used. SC layer 25 of thickness 251, preferably formed epitaxially (hereafter EPI-1 layer 25 or EPI-1 25), is provided above BOX layer 24. Where transistors 20 are to be NPN transistors, EPI-1 layer 25 is preferably P type. Thickness 251 of EPI-1 layer 25 is usefully in the range of about 0.2 to 6.0 micrometers, preferably in the range of about 0.4 to 3.5 micrometers, but thicker or thinner layers can also be used. EPI-1 layer 25 usefully has doping in the range of about 5E14 to 1E16 cm$^{-3}$, preferably about 1E15 to 5E15 cm$^{-3}$, but higher or lower doping levels can also be used. EPI-1 layer 25 has upper surface 27. Structure 506 results.

Figure 7:
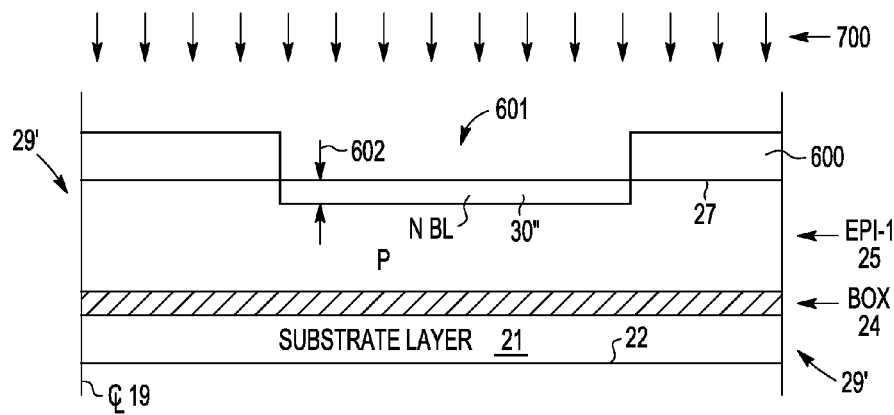

Referring now to manufacturing stage 407 of FIG. 7, mask 600 having opening 601 is provided on surface 27 of structure 506. Opening 601 has lateral dimensions and location corresponding approximately to the desired eventual location of buried layer (BL) collector 30. Implant 700 is provided through opening 601 to form (e.g., N type) doped region 30" of thickness 602. Implant 700 is, for example, phosphorus with a dose usefully in the range of about 8E11 to 5E13 cm$^{-2}$ and preferably in the range of about 1E12 to 6E12 cm$^{-2}$, at energies usefully in the range of about 30 KeV to 2 MeV and preferably in the range of about 40 KeV to 200 KeV, but other impurities and larger or smaller doses and other energies can also be used. Structure 507 results.

Figure 8:
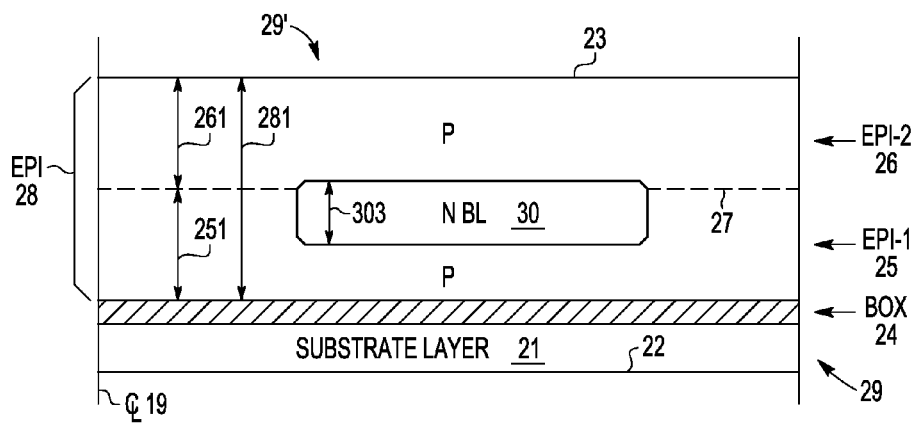

Referring now to manufacturing stage 408 of FIG. 8, mask 600 of structure 507 is removed and SC layer 26 (hereafter EPI-2 layer 26 or EPI-2 26) of thickness 261 having upper surface 23 is provided over surface 27 of EPI-1 layer 25, preferably by epitaxial growth, but other formation techniques can also be used. EPI-2 layer 26 is preferably P type where transistors 20 are NPN transistors, with doping usefully in the range of about 5E14 to 1E16 cm$^{-3}$ and preferably in the range of about 1E15 to 5E15 cm$^{-3}$, but other doping densities may also be used. In a preferred embodiment, the doping of EPI-1 layer 25 and EPI-2 layer 26 are substantially similar, but different doping levels may also be used in EPI-1 layer 25 and EPI-2 layer 26. Thickness 261 of EPI-2 layer 26 is usefully in the range of about 1.0 to 6.0 micrometers, preferably in the range of about 2.0 to 4.0 micrometers. Stated another way, thickness 281 of EPI layer 28 is usefully in the range of about 3 to 12 micrometers, preferably in the range of about 4 to 8 micrometers. During the heat treatment associated with the formation of SC layer 26, doped region 30" diffuses thereby forming BL collector 30 of thickness 303 generally greater than thickness 602 of FIG. 7 where out-diffusion from doped region 30" occurs. BL collector 30 resulting from the foregoing steps has (e.g., N type) doping concentration usefully in the range of about 1E15 to 1E18 cm$^{-3}$, more conveniently in the range of about 1E16 to 1E17 cm$^{-3}$, and preferably in the range of about 2E16 to 8E16 cm$^{-3}$. It will be noted that (e.g., N type) BL collector 30 is surrounded above and below by (e.g., P type) regions or layers 25, 26 of opposite conductivity type. This arrangement in combination with the relatively low doping of BL collector 30 compared to typical BL doping, facilitates depletion of BL collector 30 during operation of completed transistor 20. This spreads the collector electric field and assists in maximizing the breakdown voltage of transistors 20. The BOX architecture is leveraged to prevent any undesirable currents between base and the substrate, as the collector does not serve as an isolating element in contrast to prior art. While forming doped region 30" prior to forming EPI-2 layer 26 is convenient and allows for relatively precise control of the doping of layers 26 and 25 above and below BL collector 30, any other means of providing BL 30 may be used in other embodiments, as for example and not intended to be limiting, implanting BL collector 30 after formation of SC layer 28 as a whole. Such alternative arrangements are useful. Structure 508 results.

Figure 9:
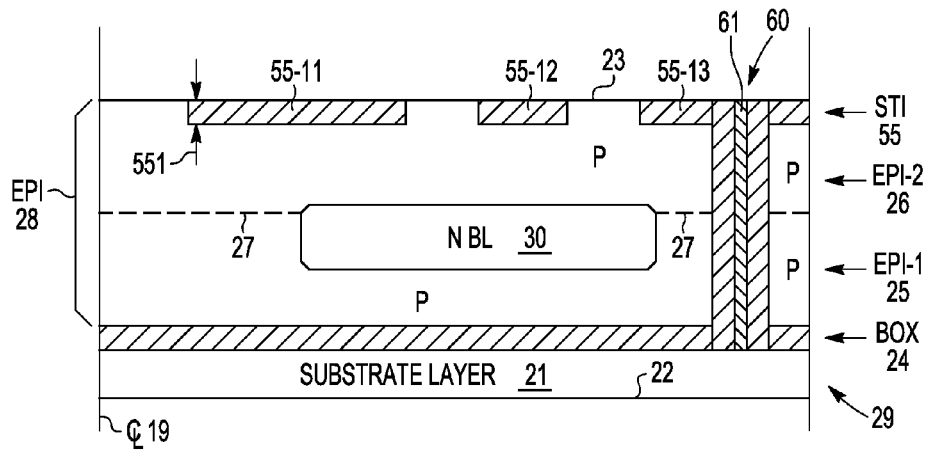

Referring now to manufacturing stage 409 of FIG. 9, STI regions 55 and DTI region 60 with conductive core 61 are provided extending into SC EPI layer 28 from surface 23. STI regions 55-11, 55-12, 55-13 are particularly illustrated in FIG. 9, but persons of skill in the art will understand that STI regions 55-21, 55-22, 55-23, etc., could likewise be formed in EPI 28 from surface 23. STI regions 55 are preferably of silicon oxide, formed for example, by high density plasma chemical vapor deposition and have thickness 551 usefully in the range of about 0.2 to 0.8 micrometers and preferably in the range of about 0.3 to 0.6 micrometers, but larger or smaller thicknesses and other materials may also be used. As will be subsequently explained in connection with manufacturing stage 410, STI regions 55-11 and 55-21 are used to partially attenuate the implant used to form second emitters 43 and underlying second base regions 51, therefore, it is desirable that the material and thickness of such STI regions be chosen with such implant attenuation in mind (along with the intended implant conditions). Persons of skill in the art will understand how to do this based upon the desired doping of such regions described in connection with manufacturing stage 410. Techniques for forming dielectric STI regions 55 and DTI regions 60 (with or without conductive core 61) are well known in the art. Structure 509 results from manufacturing stage 409.

Figure 10:
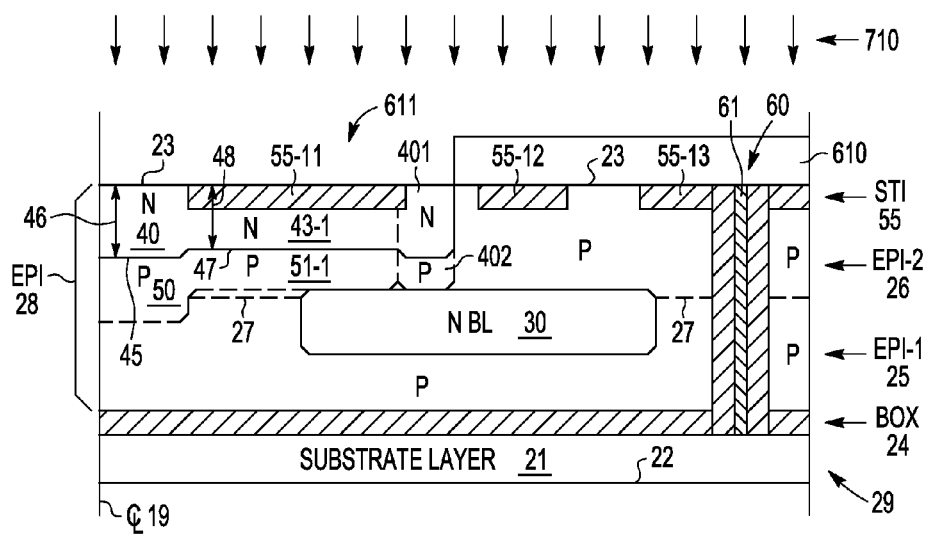

Referring now to manufacturing stage 410 of FIG. 10, mask 610 having opening 611 is applied over surface 23 of structure 509 of FIG. 9. Implant 710 is provided through opening 611 in mask 610. Implant 710 is desirably a chain implant, adapted to provide in a single implant step, both first emitter regions 40 and second emitter regions 43 (e.g., 43-1 in device 20-1 and 43-2 in device 20-2, 20-3, 20-4) using a relatively shallow (e.g., N type) implant, and provide first base regions 50 and second base regions 51 (e.g., 51-1 in device 20-1 and 51-2 in device 20-2, 20-3, 20-4) using a relatively deeper (e.g., P type) implant. For NPN transistors, phosphorous is a non-limiting example of a suitable dopant for the N type implant and boron is a non-limiting example of a suitable dopant for the P type implant. Where other transistor types (e.g., PNP) are desired, persons of skill in the art will understand how to chose appropriate dopants. Multiple N-type implants may be used to generate the desired doping profile depending on the available thermal budget for diffusion. In forming second emitters 43 and second bases 51, implants with sufficiently low energy will be blocked, for example, by STI region 55-11, while higher energy implants can penetrate STI region 55-11 and contribute to doping of the SC underneath STI region 55-11. In first emitter region 40, lower energy implants as part of the implant chain may diffuse downwards, adding to the final concentration in first emitter region 40. In contrast, low energy dopants stopped in STI region 55-11 during implantation will remain trapped therein due to their much lower diffusivity in the dielectric material (e.g., oxide) of which STI region 55-11 is formed. For STI thickness 551 (see FIG. 9) in the range of about 0.3 to 0.6 micrometers, high energy phosphorous implants are desirably made at energies in the range of about 400 KeV to 1 MeV, so as to provide second emitter region 43-1, and low energy phosphorus implants are desirably made at energies below 400 keV for so as to increase the doping near surface 23 in first emitter region 40, but higher or lower energies may also be used depending upon the desired junction depths and the thickness of STI region 55-11.

Both, N type and P type high energy implants are preferably performed at a 0 degree tilt for maximal channeling of ions for emitter region 40 and base region 50. In contrast, the thick oxide layer of the STI suppresses channeling of implant ions for emitter region 43-1 and base region 51-1, resulting in a different emitter-base depth profile in the second emitter region for the same implant chain as used for the first emitter region. It is well known in the art, that channeling for high energy ions will result in a double peak profile consisting of a shallower primary peak and a deeper channeling peak with channeling tail. While, in preferred embodiments, the P type profile of first base region 50 exhibits such a double peak structure, the second base region profile 51-1 only shows a single peak profile containing essentially the same dose as implanted into region 50 at about the same depth as the primary peak of region 50 as channeling is suppressed due to the STI. Therefore, after implanting the high energy P type impurities, there is a broad double peak profile of lower peak concentration in region 50, and a sharper single peak profile with higher peak concentration in region 51-1. The higher energy N type implants are performed subsequently. In preferred embodiments, the channeling tail of the higher energy portion of the N type implants in 40 counter dopes the shallower portions of the underlying base region 50 leading to decreased net base doping and deeper emitter-base junction in the first base region 50. In contrast, channeling is suppressed under the STI in region 43-1 such that the N type profile does not significantly overlap with the underlying P type base profile resulting in a shallower emitter-base junction and heavier base doping in the second base region 51-1 compared to the first.

First emitter region 40 (e.g., N type) desirably has a first emitter doping concentration in the range of about 1E16 to 1E18 cm$^{-3}$, and preferably about 8E16 cm$^{-3}$. First base region 50 (e.g., P type) desirably has a first base doping concentration in the range of about 1E16 to 1E18 cm$^{-3}$, and preferably about 4E16 cm$^{-3}$. PN junction 45 formed between first emitter region 40 and first base region 50 has depth 46 conveniently in the range of about 1 to 3 micrometers beneath surface 23 and preferably about 1.7 micrometers beneath surface 23, but deeper and shallower junctions and higher and lower doping concentrations may also be used. When STI region 55-11 is formed of silicon oxide about 0.4 micrometers thick, second emitter region 43-1 (e.g., N type) desirably has a second emitter doping concentration beneath STI region 55-11 in the range of about E16 to 1E18 cm$^{-3}$, and preferably about 5E16 cm$^{-3}$. Second base region 51-1 (e.g., P type) is located beneath second emitter region 43-1 and has second base doping concentration in the range of about 1E16 to 1E18 cm$^{-3}$, and preferably about 6E16 cm$^{-3}$. PN junction 47 formed between second emitter region 43-1 and second base region 51-1 has junction depth 48 usefully in the range of about 1 to 3 micrometers beneath surface 23 and preferably about 1.5 micrometers beneath surface 23, but deeper and shallower junctions and higher and lower concentrations may also be used. Stated another way, it is desirable that second emitter region 43-1 have a second emitter doping concentration that is less than the first emitter doping concentration by a factor of about 1 to 100 and preferably by a factor of about 1.5. It is further desirable that second base region 51-1 has a second base doping concentration that is greater than the first base doping concentration by a factor of about 1 to 10 and preferably by a factor of about 1.5. Structure 510 results from manufacturing stage 410.

Figure 11:
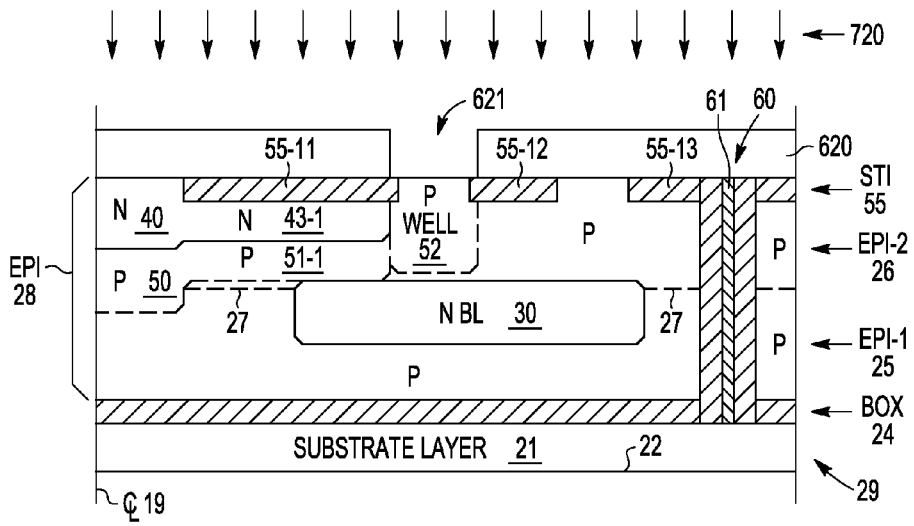

Referring now to manufacturing stage 411 of FIG. 11, mask 610 of stage 410 is desirably removed and replaced by mask 620 having opening 621. Implant 720 (e.g., P type) is applied through opening 621 to form WELL 52 (e.g., P type) extending from surface 23 toward collector BL 30 sufficiently to provide a relatively low resistance Ohmic contact to second base region 51-1, but deeper or shallower implants may also be used. Opening 621 for forming (e.g., P type) WELL 52 may laterally overlap regions 43-1 and 51-1. WELL 52 usefully has (e.g., P type) doping in the range of about 1E17 to 5E18 cm$^{-3}$ and preferably has doping in the range of about 2E17 to 2E18 cm$^{-3}$. Structure 511 results.

Figure 12:
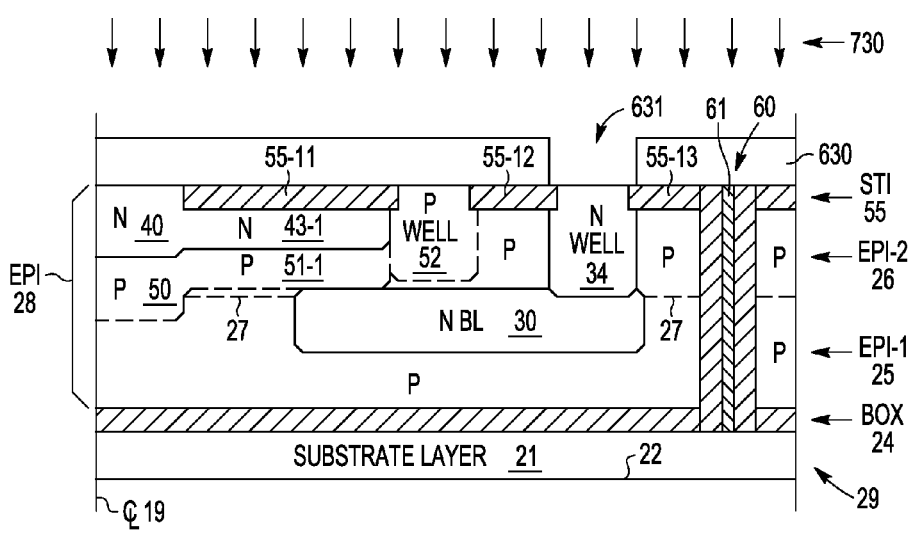
Figure 13:
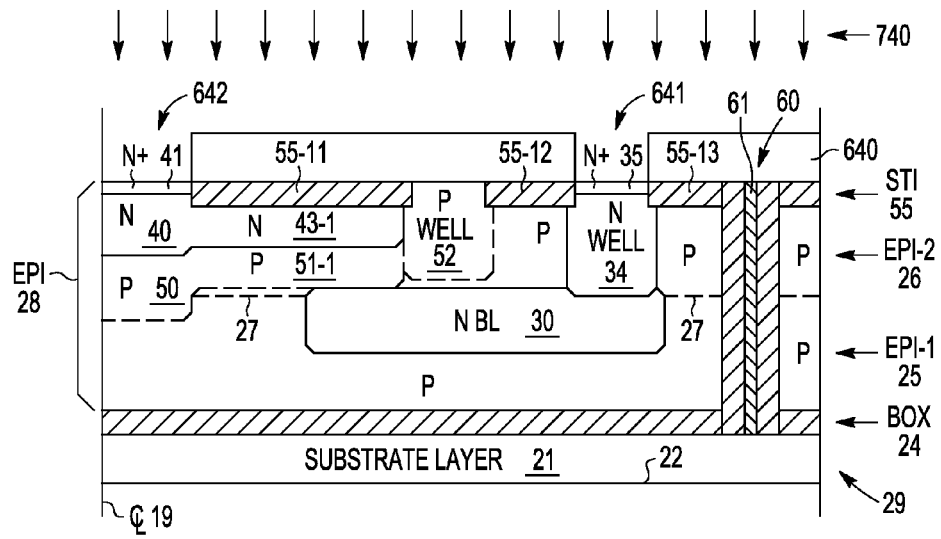
Figure 14:
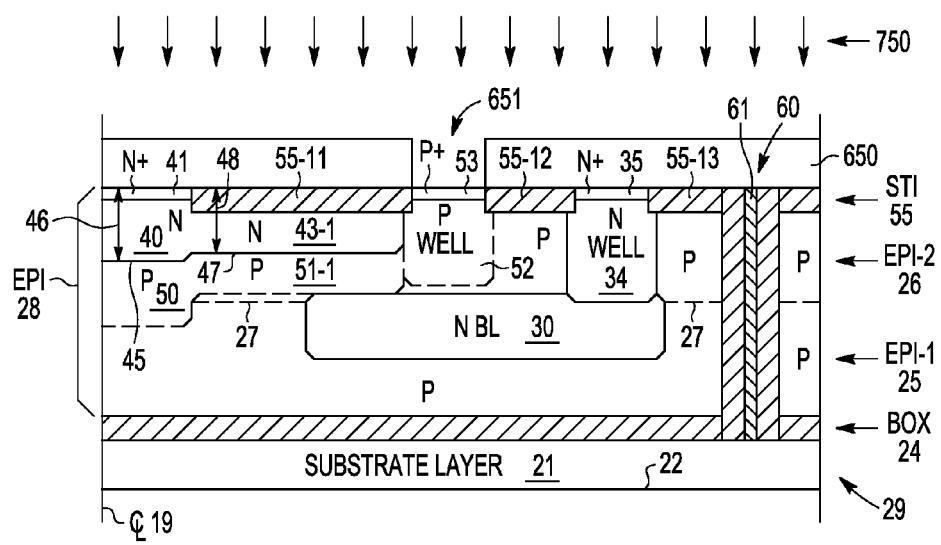

Referring now to manufacturing stage 412 of FIG. 12, mask 620 of stage 411 is replaced by mask 630 having opening 631. Implant 730 (e.g., N type) is provided through opening 730 to form WELL 34 (e.g., N type) extending substantially from surface 23 to BL collector 30 with which it makes Ohmic contact, so as to electrically couple BL collector 30 to surface 23. Structure 512 results. Referring now to manufacturing stage 413 of FIG. 13, mask 630 of stage 412 is replaced by mask 640 having openings 641, 642. Implant 740 (e.g., N type) is provided through openings 641, 642 to form (e.g., N+) collector contact region 35 under opening 641 making Ohmic contact to (e.g., N type) WELL 34 and to form (e.g., N+) emitter contact region 41 under opening 642 making Ohmic contact to first emitter region 40. Structure 513 results. In the case of device 20-4 of FIG. 4, opening 642 extends further to the left of region 40 so that (e.g., N+) portion 41-4 makes junction contact to underlying portion 263 of EPI-2 layer 26, as shown in FIG. 4. Referring now to manufacturing stage 414 of FIG. 14, mask 640 is removed and replaced by mask 650 having opening 651. Implant 750 (e.g., P type) is made through opening 651 to form (e.g., P+) base contact to (e.g., P type) WELL 52. Structure 514 results. Other than removing mask 650 and providing conventional interconnections to contact regions 35, 41, 53 (depending on how the device is being coupled to other circuit elements) and conventional passivation layers (not shown) above surface 23, device 20 is substantially complete.

For transistors 20-1, 20-2, and 20-3, the majority of carriers (e.g., electrons) are injected from first emitter region 40 into first base region 50 in an approximately vertical direction, which gives rise to a high current gain. In transistor 20-4, most electrons are injected from emitter contact region 41-4 into lightly doped base region 263, which can provide an even higher current gain than that attained in transistors 20-1, 20-2, 20-3. The Early voltage of transistors 20-1, 20-2, and 20-3 is determined by two bipolar transistors connected in parallel. One bipolar transistor is formed by first emitter 40, first base 50 and EPI 28, and collector 30 at lateral distance 32-1. Another bipolar transistor is formed by second emitter 43-1, second base 51-1 in transistor 20-1, second base 51-2 and EPI 28 between region 51-2 in transistor 20-2 and 20-3, and BL collector 30. For transistor 20-4, portion 41-4 also plays an important role in determining the Early Voltage. When BL collector 30 is placed at least partially underlying emitter 43-1, as for example in FIG. 1, high gain but relatively low Early Voltage are obtained. When BL collector 30 is pulled laterally away from emitter 43-1, as for example in FIGS. 2-4, the current gain is reduced due to the larger base width but the Early Voltage is increased. Accordingly, BL collector 30 of bipolar transistors 20-1, 20-2, 20-3, 20-4, etc., can be placed in various lateral positions relative to first and second emitter regions 40, 43, thereby permitting a wide range of device characteristics to be obtained to suit specific applications, merely by mask changes without adding further process steps. In transistors 20-1, 20-2, 20-3, 20-4, emitter 43 has a moderate doping concentration, and it can be depleted by extrinsic base WELL 52 proximate junction 49 and by intrinsic base 51 underneath emitter region 43, which significantly improves BVebo. A field plate located on STI region 55-11 above junction 49 (e.g., as shown for device 20-3 of FIG. 3) may be used to assist the depletion and further improve the break-down voltage. In addition, because of the relatively light doping of BL collector 30, it can be fully depleted from all directions by the surrounding P-regions biased with the base (or other) potential when the collector voltage is high relative to other terminals. This combination of features significantly improves BVcbo and BVceo and provides transistors 20-1, 20-2, 20-3, 20-4 in FIGS. 1-5 a high side capability. Accordingly, transistors 20-1, 20-2, 20-3, 20-4 facilitate tuning the bipolar transistor characteristics by, among other things, varying the position of the BL collector 30 relative to other elements without sacrificing the breakdown voltages and high side capability. This is very useful.

According to a first embodiment, there is provided a bipolar transistor (20), comprising, a semiconductor substrate (29) having a first surface (23), a first emitter region (40) of a first conductivity type in the semiconductor substrate (29) having a first emitter region doping concentration, a first base region (50) of a second, opposite conductivity type in the semiconductor substrate (29) underlying the first emitter region (40, 41-4) and having a first base region doping concentration, the first base region (50) forming a first PN or NP junction (45, 59) with the first emitter region (40) at a first depth (46) from the first surface (23), a second emitter region (43) of the first conductivity type in the semiconductor substrate (29) having a second emitter region doping concentration and Ohmically coupled to the first emitter region (40), a second base region (51) of the second conductivity type in the semiconductor substrate (29) underlying the second emitter region (43) and having a second base region doping concentration different than the first base doping concentration, the second base region (51) forming a second PN or NP junction (47) with the second emitter region (51) at a second depth (48) from the first surface (23), and a buried layer collector region (30) of the first conductivity type in the substrate (29) underlying the first surface (23) and laterally spaced a third distance (32) from the first emitter region (40). According to a further embodiment, the first emitter region (40) and the second emitter region (43) are laterally adjacent. According to a further embodiment, the first base region (50) and the second base region (51) are laterally adjacent. According to a still further embodiment, the first depth is greater than the second depth. According to a yet further embodiment, the second emitter region (43) lies laterally at least partly between the first emitter region (40) and the buried layer collector region (30). According to a still yet further embodiment, the second base region (51) lies laterally at least partly between the first base region (50) and the buried layer collector region (30). According to a yet still further embodiment, the transistor (20) further comprises a third emitter region (41-4) of a third emitter doping concentration and a third base region (263) of a third base doping concentration, wherein the third emitter region (41-4) is coupled to the first emitter region (40) and the third base region is coupled to the first base region (50) and the third base doping concentration is less than the first base doping concentration. According to another embodiment, the second emitter region (43) has a lateral extent (44) greater than the third distance (32). According to still another embodiment, the second emitter region (43) has a lateral extent (44) less than the third distance (32).

According to a second embodiment, there is provided a method for forming a bipolar transistor, comprising, providing a semiconductor containing substrate (29) with an upper surface (23), and having therein a buried layer collector region (30) of a first conductivity type located below the upper surface (23) and of a buried layer collector region doping concentration, wherein a first portion (25) of the substrate located below the buried layer collector region (30) and a second portion (26) of the substrate located above the buried layer collector region (30) are of a second, opposite conductivity type, forming during one or more first doping steps in the second portion (26) of the substrate (29), first (40) and second (43) adjacent emitter regions of the first conductivity type near the first surface, the first emitter region extending substantially to the first surface and laterally separated from the buried layer collector region (30), and forming during one or more second doping steps in the second portion (26) of the substrate (29), first (50) and second (51) adjacent base regions of the second conductivity type, respectively, beneath the first (40) and second (43) emitter regions, wherein the first base region (50) has a first base region doping concentration and the second base region (51) has a second base region doping concentration different than the first base region doping concentration, and the first emitter region (40) and first base region (50) providing a first NP or PN junction (45) at a first depth (46) beneath the upper surface (23) and the second emitter region (43) and the second base region (51) providing a second NP or PN junction (47) at a second depth (48) beneath the upper surface (23). According to a further embodiment, the method further comprises providing at least one isolation region (55-11, 55-21) substantially at the upper surface (23), wherein the second emitter region (43) and the second base region (51) substantially underlie the at least one isolation region (55-11, 55-21). According to a still further embodiment, the one or more first doping steps and the one or more second doping steps are performed during one or more chain implants of dopants of opposite conductivity type. According to a still further embodiment, the buried layer collector region (30) and the second base region (51) are laterally arranged so that the buried layer collector region (30) extends underneath the second base region (51). According to a yet further embodiment, the buried layer collector region (30) and the second base region (51) are laterally arranged so that the buried layer collector region (30) does not extend underneath the second base region (51). According to a still yet further embodiment, the method further comprises forming a third emitter region (41-4) and third base region (263) having an NP or PN junction (59) there between, laterally arranged on a side of the first emitter region (40) opposite the second emitter region (43).

According to a third embodiment, there is provided a bipolar transistor (20) having a first surface (23), comprising, first (45) and second (47) connected emitter-base junctions having, respectively, first (46) and second (48) different junction depths beneath the first surface (23), and a buried layer collector region (30) having a third depth (304) beneath the first surface (23), the third depth (304) being greater than the first (46) or second (48) depths, wherein the buried layer collector region (30) does not underlie the first (45) emitter-base junction. According to a further embodiment, the buried layer collector region (30) underlies at least a portion of the second emitter-base junction (47). According to a still further embodiment, the transistor (20) further comprises an isolation region (55-11, 55-21) overlying the second emitter-base junction (47) but not overlying the first emitter-base junction (45). According to a yet further embodiment, the transistor (20) still further comprises a conductive gate (65) on the isolation region (55-21) overlying a portion (49) of the second emitter-base junction (47). According to a still yet further embodiment, the conductive gate (65) is electrically coupled to a base region (51) of the second emitter-base junction (47).

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for producing a bipolar transistor, comprising:
providing a semiconductor-containing substrate with an upper surface, and having therein a buried layer collector region of a first conductivity type located below the upper surface and of a buried layer collector region doping concentration, wherein a first portion of the substrate located below the buried layer collector region and a second portion of the substrate located above the buried layer collector region are of a second, opposite conductivity type;
during one or more first doping steps, forming in the second portion of the substrate first and second adjacent emitter regions of the first conductivity type near the first surface, the first emitter region extending substantially to the first surface and laterally separated from the buried layer collector region; and
during one or more second doping steps, forming in the second portion of the substrate first and second adjacent base regions of the second conductivity type, respectively, beneath the first and second emitter regions, wherein the first base region has a first base region doping concentration and the second base region has a second base region doping concentration different than the first base region doping concentration, and the first emitter region and first base region providing a first NP or PN junction at a first depth beneath the upper surface, and the second emitter region and the second base region providing a second NP or PN junction at a second depth beneath the upper surface.

2. The method of claim 1, further comprising providing at least one isolation region substantially at the upper surface, wherein the second emitter region and the second base region substantially underlie the at least one isolation region.

3. The method of claim 1, wherein the one or more first doping steps and the one or more second doping steps are performed during one or more chain implants of dopants of opposite conductivity type.

4. The method of claim 1, wherein the buried layer collector region and the second base region are laterally arranged so that the buried layer collector region extends underneath the second base region.

5. The method of claim 1, wherein the buried layer collector region and the second base region are laterally arranged so that the buried layer collector region does not extend underneath the second base region.

6. The method of claim 1, further comprising forming a third emitter region and third base region having an NP or PN junction there between, laterally arranged on a side of the first emitter region opposite the second emitter region.

7. A method for producing a bipolar transistor, comprising:
forming first emitter region of a first conductivity type in a semiconductor substrate having a first emitter region doping concentration;
forming a first base region of a second, opposite conductivity type in the semiconductor substrate underlying the first emitter region and having a first base region doping concentration, the first base region forming a first PN or NP junction with the first emitter region at a first depth from a first surface of the semiconductor substrate;
forming a second emitter region of the first conductivity type in the semiconductor substrate having a second emitter region doping concentration and Ohmically coupled to the first emitter region;
forming a second base region of the second conductivity type in the semiconductor substrate underlying the second emitter region and having a second base region doping concentration greater than the first base doping concentration, the second base region forming a second PN or NP junction with the second emitter region at a second depth from the first surface less than the first depth; and
forming a buried layer collector region of the first conductivity type in the substrate underlying the first surface and laterally spaced a third distance from the first emitter region.

8. The method of claim 7, wherein the first emitter region and the second emitter region are formed at laterally adjacent locations.

9. The method of claim 7, wherein the first base region and the second base region are formed at laterally adjacent locations.

10. The method of claim 7, wherein the second emitter region is formed to extend laterally at least partly between the first emitter region and the buried layer collector region.

11. The method of claim 7, wherein the second base region is formed to extend laterally at least partly between the first base region and the buried layer collector region.

12. The method of claim 7, further comprising:
forming a third emitter region of a third emitter doping concentration coupled to the first emitter region; and
forming a third base region of a third base doping concentration coupled to the first base region, the third base doping concentration is less than the first base doping concentration.

13. The method of claim 7, wherein the second emitter region is formed to have a lateral extent greater than the third distance.

14. The method of claim 7, wherein the second emitter region is formed to have a lateral extent less than the third distance.

15. A method for producing a bipolar transistor, comprising:
forming a first emitter region of a first conductivity type in a semiconductor substrate having a first emitter region doping concentration;
forming a first base region of a second, opposite conductivity type in the semiconductor substrate underlying the first emitter region and having a first base region doping concentration, the first base region forming a first PN or NP junction with the first emitter region at a first depth from a first surface of the semiconductor substrate;

forming a second emitter region of the first conductivity type in the semiconductor substrate having a second emitter region doping concentration and Ohmically coupled to the first emitter region;

forming a second base region of the second conductivity type in the semiconductor substrate underlying the second emitter region and having a second base region doping concentration, the second base region forming a second PN or NP junction with the second emitter region at a second depth from the first surface, the second depth shallower than the first depth;

forming an isolation feature overlying the second emitter region; and forming an emitter contact in the first emitter region and adjacent the isolation feature, the juncture between the emitter contact and the isolation feature generally aligning with the juncture between the first emitter region and the second emitter region and the juncture between the first base region and the second base region.

16. The method of claim 15 wherein the second base doping concentration is greater than the first base doping concentration.

17. The method of claim 15, wherein the first emitter region and the second emitter region are formed in an upper epitaxial layer of the semiconductor substrate.

18. The method of claim 17, wherein the buried layer collector region is formed, at least in substantial part, in a lower epitaxial layer of the semiconductor substrate.

19. The method of claim 15, further comprising:
forming a base contact over the semiconductor substrate;
forming a WELL region of the second conductivity type in ohmic contact with the base contact; and
forming a buried layer collector region of the first conductivity type in the semiconductor substrate underlying the first surface and having a portion extending under the WELL region;
wherein the second emitter region is formed to extend laterally from the first emitter region to the WELL region.

20. The method of claim 15, wherein the second emitter region is formed to have a doping concentration less than the first emitter region doping concentration by a factor of about 1 to 100, and wherein the second base region is formed to have a doping concentration greater than the first base region doping concentration by a factor of about 1 to 10.

* * * * *